(12) United States Patent
Jung et al.

(10) Patent No.: US 9,666,734 B2
(45) Date of Patent: May 30, 2017

(54) EMITTER WRAP-THROUGH SOLAR CELL AND METHOD OF PREPARING THE SAME

(71) Applicant: Hanwha Chemical Corporation, Seoul (KR)

(72) Inventors: Woo-Won Jung, Gyeonggi-do (KR); Jae Eock Cho, Seoul (KR); Hong Gu Lee, Daejeon (KR); Deoc Hwan Hyun, Daejejon (KR); Yong Hwa Lee, Daejeon (KR)

(73) Assignee: Hanwha Chemical Corporation (KR)

( * ) Notice: Subject to any disclaimer, the term of this patent is extended or adjusted under 35 U.S.C. 154(b) by 295 days.

(21) Appl. No.: 14/402,120

(22) PCT Filed: May 14, 2013

(86) PCT No.: PCT/KR2013/004265
§ 371 (c)(1),
(2) Date: Nov. 19, 2014

(87) PCT Pub. No.: WO2013/183867
PCT Pub. Date: Dec. 12, 2013

(65) Prior Publication Data
US 2015/0129026 A1      May 14, 2015

(30) Foreign Application Priority Data

Jun. 4, 2012 (KR) .................. 10-2012-0059871

(51) Int. Cl.
*H01L 31/0224* (2006.01)
*H01L 31/0236* (2006.01)
(Continued)

(52) U.S. Cl.
CPC ............. *H01L 31/022458* (2013.01); *H01L 31/02167* (2013.01); *H01L 31/02168* (2013.01);
(Continued)

(58) Field of Classification Search
CPC ..... H01L 31/022458; H01L 31/022441; H01L 31/0224; H01L 31/02245; H01L 31/0236;
(Continued)

(56) References Cited

U.S. PATENT DOCUMENTS 5,468,652 A    11/1995  Gee
5,928,438 A *   7/1999  Salami ............ H01L 31/022425
                                                136/255

(Continued)

FOREIGN PATENT DOCUMENTS

CN       1938819 A     3/2007
CN     101124681 A     2/2008
(Continued)

OTHER PUBLICATIONS

Kida et al. (JPH0575149A, 1993) English machine translation.*
(Continued)

*Primary Examiner* — Susan D Leong
(74) *Attorney, Agent, or Firm* — Lerner, David, Littenberg, Krumholz & Mentlik, LLP

(57) ABSTRACT

The present invention relates to an emitter wrap-through solar cell and a method for preparing the same. The solar cell according to the present invention has a structure that may minimize generation of leakage current and minimize energy conversion efficiency measurement error. And, the preparation method of a solar cell according to the present invention may easily confirm the alignment state of the electrode, and thus, provide more improved productivity.

14 Claims, 5 Drawing Sheets

(51) Int. Cl.
*H01L 31/18* (2006.01)
*H01L 31/068* (2012.01)
*H01L 31/0216* (2014.01)

(52) U.S. Cl.
CPC .... *H01L 31/02363* (2013.01); *H01L 31/0682* (2013.01); *H01L 31/1804* (2013.01); *Y02E 10/547* (2013.01)

(58) Field of Classification Search
CPC ......... H01L 31/02363; H01L 31/02164; H01L 31/02165; H01L 31/0682
See application file for complete search history.

(56) References Cited

U.S. PATENT DOCUMENTS

| | | |
|---|---|---|
| 2005/0172996 A1 | 8/2005 | Hacke et al. |
| 2005/0176164 A1 | 8/2005 | Gee et al. |
| 2008/0035198 A1* | 2/2008 | Teppe ............. H01L 31/022433 136/256 |
| 2008/0210294 A1* | 9/2008 | Moslehi .......... H01L 31/035281 136/251 |
| 2009/0211628 A1 | 8/2009 | Engelhart et al. |
| 2010/0032014 A1 | 2/2010 | Bettinelli et al. |
| 2010/0258182 A1 | 10/2010 | Akimoto |
| 2010/0288350 A1 | 11/2010 | Lee et al. |
| 2010/0308401 A1* | 12/2010 | Narazaki ............. H01L 29/4236 257/330 |
| 2010/0319768 A1* | 12/2010 | Mitchell ......... H01L 31/022433 136/256 |
| 2011/0070676 A1 | 3/2011 | Nakayashiki et al. |
| 2011/0081745 A1* | 4/2011 | Wu ................. H01L 31/022425 438/98 |
| 2012/0017981 A1 | 1/2012 | Chung et al. |

FOREIGN PATENT DOCUMENTS

| | | |
|---|---|---|
| DE | 102005040871 A1 | 10/2006 |
| JP | 05075149 A | 3/1993 |
| JP | 2012049183 A | 3/2012 |
| KR | 20120051807 A | 5/2012 |
| TW | 201041157 A | 11/2010 |
| WO | 2006029250 A2 | 3/2006 |
| WO | 2010122935 A1 | 10/2010 |

OTHER PUBLICATIONS

Harder N-P et al: "Laser-processed high-efficiency silicon RISE-EWF solar cells and characterization", Physica Status Solidi (C), Wiley—VCH Verlag, Berlin, DE, vol. 6, No. 3, Jan. 14, 2009, pp. 736-743.
Extended European Search Report for Application No. 13800382.7 dated Nov. 24, 2015.
International Search Report and Written Opinion for Application No. PCT/KR2013/004265 dated Aug. 27, 2013.

* cited by examiner

EMITTER WRAP-THROUGH SOLAR CELL AND METHOD OF PREPARING THE SAME

CROSS-REFERENCE TO RELATED APPLICATIONS

The present application is a national phase entry under 35 U.S.C. §371 of International Patent Application No. PCT/KR2013/004265, filed May 14, 2013, published in English, which claims the priority from Korean Application No. 10-2012-0059871, filed Jun. 4, 2012, the disclosures of which are incorporated herein by reference.

TECHNICAL FIELD

The present invention relates to a back-contact type of solar cell having an emitter wrap-through structure and a method for preparing the same.

BACKGROUND OF ART

In general, a solar cell has electrodes respectively on the front and rear side of a semiconductor substrate, and as a front electrode is disposed on the front side, which is a light-receiving side, a light-receiving area decreases by the area of the front electrode. To overcome the problem of reducing the light-receiving area, a back-contact type of solar cell has been proposed.

A back-contact type of solar cell is divided into MWA (metallization wrap around), MWT (metallization wrap-through), EWT (emitter wrap-through), back-junction, and the like according to the structure.

FIG. 1 shows an enlarged part of the rear side (i.e., a side opposite to the front side facing the sun during normal operation) of a common emitter wrap-through solar cell (hereinafter referred to as 'EWT solar cell'). According to FIG. 1, both a base electrode (15) and an emitter electrode (25) having different conductivity are located on the rear side of the EWT solar cell, and the emitter electrode (25) is formed in a trench that is formed on the rear side of the substrate for the separation of p-n junction. That is, a common EWT solar cell has a structure with a height difference between the base electrode (15) and the emitter electrode (25) (for example, a structure wherein the base electrode is about 10 to 30 μm higher than the emitter electrode).

Meanwhile, an energy conversion efficiency measurement error of the EWT solar cell may be minimized as uniform pressure is applied to the rear side of the cell, but due to the structural property of the EWT solar cell (particularly, a height difference between the base electrode and the emitter electrode), non-uniform contact pressure is generated and thus a large energy conversion efficiency measurement error is generated.

In the preparation process of a common EWT solar cell, a base electrode and an emitter electrode are formed by printing or coating each electrode forming material on corresponding area of a substrate, but in the printing or coating process, there is a limitation in exact confirmation of the alignment state, That is confirming if each electrode is formed on the exact desired location.

Further, due to the structural property of the EWT solar cell, despite the separation of the p-n junction, since the distance between the base electrode and the emitter electrode is small, a leakage current may be generated.

DETAILED DESCRIPTION OF THE INVENTION

Technical Problem

It is an object of the present invention to provide an EWT solar cell having a structure wherein a base electrode and an emitter electrode are more effectively isolated to minimize generation of a leakage current and minimize an energy conversion efficiency measurement error.

It is another object of the present invention to provide a method for preparing the EWT solar cell, which may confirm the alignment state of the base electrode and emitter electrode in a more simplified way.

Technical Solution

According to one embodiment, there is provided an emitter wrap-through solar cell including:

a first conductive type of semiconductor substrate (100) having a front side facing the sun during normal operation and a rear side opposite to the front side, wherein a first trench (10) and a second trench (20) are formed on the rear side while being physically separated, and at least one via-hole (30) penetrating the substrate through the second trench are formed; and a first conductive type of base electrode (15) formed inside of the first trench (10), and a second conductive type of emitter electrode formed inside of the second trench (20) and via-hole (30).

The first trench (10) and the second trench (20) may be physically separated from each other and interdigitated.

The semiconductor substrate (100) may be a p-type doped silicon wafer, and the front side of the semiconductor substrate (100) may be textured to an uneven structure.

The first trench (10) and the second trench (20) may be respectively independently formed on the rear side of the substrate to a width of 200 to 700 μm and a depth of 20 to 60 μm.

The via-hole (30) may have a diameter of 25 to 100 μm.

According to another embodiment of the invention, there is provided a method for preparing an emitter wrap-through solar cell, including:

preparing a first conductive type of semiconductor substrate (100) having a front side facing the sun during normal operation and a rear side opposite to the front side;

forming a first trench (10) and a second trench (20) that are physically separated from each other on the rear side, and forming at least one via-hole penetrating the substrate through the second trench;

forming a second conductive emitter layer (40) respectively on the front side of the substrate, on the inner side of the second trench (20), and on the inner side of the via-hole (30);

forming a passivation layer (60) on the rear side of the substrate and on the bottom side of the first trench (10), and forming an anti-reflection layer (65) on the front side of the substrate; and forming a first conductive type of base electrode (15) inside of the first trench (10), and forming a second conductive type of emitter electrode (25) inside of the second trench (20) and the via-hole (30).

The first trench (10) and the second trench (20) may be formed by laser grooving, and may be formed in an interdigitated form.

The via-hole (30) may be formed by laser drilling, wet etching, dry etching, mechanical drilling, water jet machining, or a combined process thereof.

Advantageous Effects

The EWT solar cell according to the present invention has a structure wherein a base electrode and an emitter electrode are effectively isolated to minimize generation of leakage current and minimize an energy conversion efficiency measurement error. The preparation method of a solar cell according to the present invention may also easily confirm the alignment state of the electrodes, and thus provide more improved productivity.

<Description of Reference Numerals and Signs>

100: semiconductor substrate
10: first trench        20: second trench       30: via-hole
15: base electrode      25: emitter electrode
40: emitter layer       50: etching-resist
60: passivation layer   65: anti-reflection layer

DETAILED DESCRIPTION OF THE EMBODIMENTS

Hereinafter, an EWT solar cell and a method for preparing the same according to embodiments of the invention will be explained.

Unless otherwise described throughout the specification, technical terms are to address specific embodiments, and are not intended to limit the present invention.

Also, singular forms include plural forms unless they have explicitly contrary meanings.

Further, the term "comprising" specifies properties, areas, integers, steps, operations, elements, or ingredients, but does not exclude addition of other properties, areas, integers, steps, operations, elements, or ingredients.

Figure 2A:
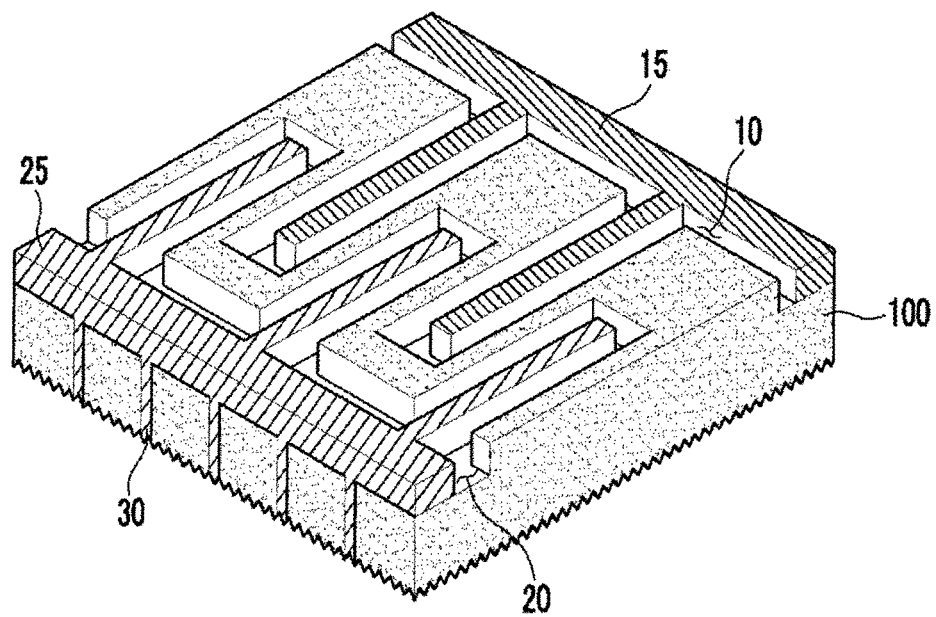
FIG. 2a and FIG. 2b, and FIG. 3a and FIG. 3b, are (a) perspective views and (b) plane views, respectively showing an enlarged part of the rear side of the EWT solar cell according to one embodiment of the invention.
Figure 3A:
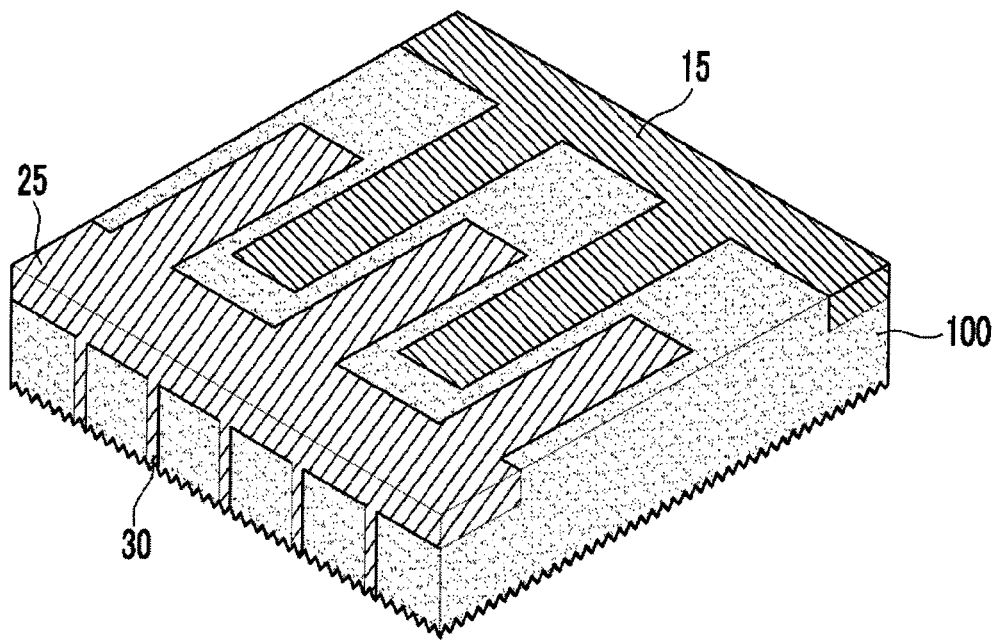

As used herein, the expression "formed inside" refers to a state of being filled so as to occupy a part or the whole of the space formed by any structure. For example, a first conductive base electrode formed inside a first trench refers to a case wherein the base electrode (15) is formed so as to occupy a part of the first trench (10) as shown in FIG. 2a, or the base electrode (15) is formed so as to occupy the whole of the first trench (10) as shown in FIG. 3a.

As used herein, terms including an ordinal such as "a first" or "a second" and the like may be used to explain various constitutional elements, but the constitutional elements are not limited thereto. The terms are used only to distinguish one constitutional element from another constitutional element. For example, a first constitutional element may be named as a second constitutional element, and similarly, a second constitutional element may be named as a first constitutional element, without departing from the right scope of the invention.

Hereinafter, embodiments of the invention will be explained in detail so that a person having ordinary knowledge in the art may easily practice it. However, the present invention may be specified in various forms, and is not limited to the examples.

The inventors confirmed during studies on EWT solar cells that since a common EWT solar cell has a structure having a height difference between a base electrode (15) and an emitter electrode (25) formed on the rear side of a substrate, a large energy conversion efficiency measurement error may be generated due to insufficient electrode isolation, and there is a limitation in exact confirmation of the alignment state of electrodes in the preparation process.

Thus, during repeated studies for solving the above problems, the inventors determined that if a first trench (10) and a second trench (20) are formed on the rear side of the substrate (100) in a physically separated form, and a base electrode (15) and an emitter electrode (25) are formed respectively inside of the first trench and inside of the second trench, a rear side curve of the substrate may be removed to minimize the energy conversion efficiency measurement error, and electrodes may be more effectively isolated thus minimizing leakage current generation. It was also confirmed that as each electrode is formed inside of each trench, the alignment state of each electrode may be exactly discriminated with the naked eye in the preparation process.

According to one embodiment of the invention, an emitter wrap-through solar cell is provided, including:

a first conductive type of semiconductor substrate (100) having a front side facing the sun during normal operation and a rear side opposite to the front side, wherein a first trench (10) and a second trench (20) are formed on the rear side while being physically separated, and at least one via-hole (30) penetrating the substrate through the second trench is formed; and a first conductive type of base electrode (15) formed inside of the first trench (10) and a second conductive type of emitter electrode formed inside of the second trench (20) and via-hole (30).

Hereinafter, the EWT solar cell according to the invention will be explained referring to FIG. 2a to FIG. 5.

The EWT solar cell according to the invention includes a semiconductor substrate (100).

The semiconductor substrate (100) has a front side facing the sun during normal operation and a rear side opposite to the front side, and the thickness may be 150 to 220 μm. However, the thickness of the substrate may be determined considering mechanical properties required for a solar cell, the depth of a trench formed in the substrate, and the like, and is not limited to the above range.

Further, the semiconductor substrate (100) has a first conductive type, wherein the first conductive type is p-type or n-type, and a second conductive type described below refers to the opposite of the first conductive type. As a non-limiting example, the semiconductor substrate (100) may be a p-type doped silicon wafer, and in addition, those common in the technical field to which the invention pertains may be applied.

The front side of the semiconductor substrate (100) is a side facing the sun during normal operation, and it may be textured so as to have an uneven structure to improve the absorption rate of incident sunlight. The uneven structure may have various forms including a regular inverted pyramid pattern.

Meanwhile, the rear side of the semiconductor substrate (100) is a side opposite to the front side, and a first trench (10) and a second trench (20) may be formed on the rear side while being physically separated from each other, and at least one via-hole (30) penetrating the substrate through the second trench may be formed. Further, a first conductive type of base electrode (15) may be formed inside of the first trench (10), and a second conductive type of emitter electrode (25) may be formed inside of the second trench (20) and the via-hole (30).

Figure 1:
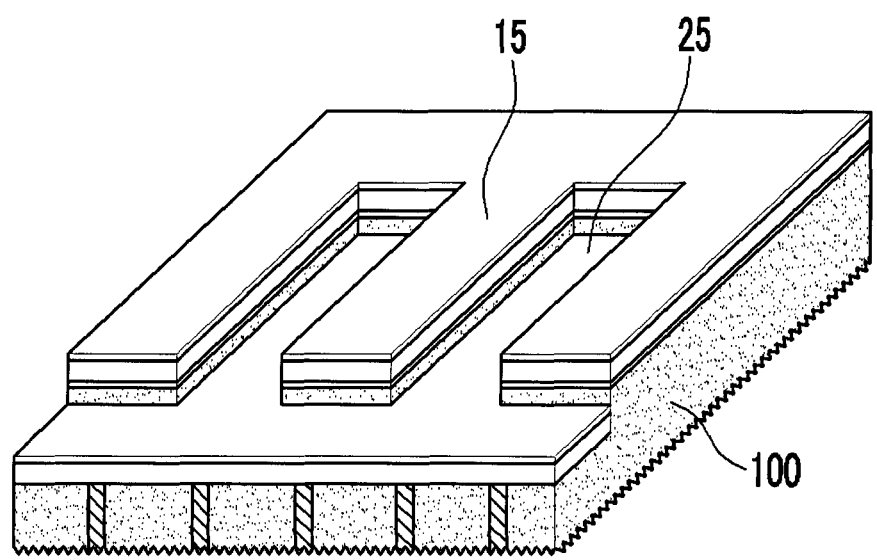
FIG. 1 is an enlarged perspective view of a part of the rear side of a common EWT solar cell.

That is, the EWT solar cell according to the present invention has a structure wherein a first trench (10) and a second trench (20) are formed on the rear side of a substrate while being physically separated from each other, and a base electrode (15) and an emitter electrode (25) are respectively formed inside thereof, unlike the previous EWT solar cell wherein one trench is formed on the rear side of a substrate and an emitter electrode is formed inside thereof as shown in FIG. 1.

Thereby, in the EWT solar cell according to the present invention, a base electrode (15) and an emitter electrode (25) are physically separated from each other and may be more effectively isolated by each trench, thus minimizing generation of leakage current when a solar cell is operated. Furthermore, unlike the previous EWT solar cell, since there is no height difference between the base electrode (15) and an emitter electrode (25) (that is, a rear side curve of the substrate may be removed), an energy conversion efficiency measurement error may be minimized.

In addition, as the base electrode (15) and the emitter electrode (25) are formed inside of each trench, the alignment state of each electrode may be exactly discriminated with the naked eye during the preparation process, thus enabling a productivity improvement of a solar cell.

According to the present invention, the first trench (10) and the second trench (20) are formed on the rear side of the substrate while being physically separated from each other, and the form is not specifically limited. However, according to the present invention, it may be advantageous in terms of improvement in the efficiency of a solar cell for the first trench (10) and the second trench (20) to be interdigitated.

The first trench (10) and the second trench (20) may be respectively independently formed on the rear side of the substrate to a width of 200 to 700 μm and a depth of 20 to 60 μm. Herein, the depth and width of each trench may be variously changed considering the width and the depth of the electrode formed inside of each trench, the effect of electrode isolation, the thickness of a substrate, and the like, and are not limited to the above range.

Meanwhile, at least one via-hole (30) penetrating the substrate through the second trench (20) may be formed in the semiconductor substrate (100).

Figure 4:
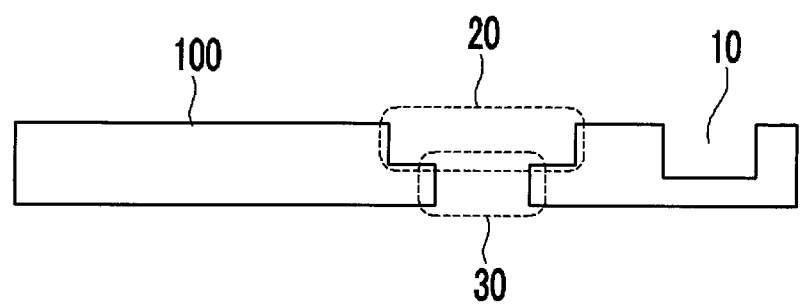
FIG. 4 shows an enlargement of a part of the cross-section of the semiconductor substrate included in the EWT solar cell according to one embodiment of the invention.

The via-hole (30) functions for electrically connecting the emitter electrode (25) with the emitter layer (40) on the front side of the substrate, and it penetrates the substrate through the second trench (20) as shown in FIG. 4.

The via-hole (30) may have a common linear shape, and it may be preferable for the cross-sectional area of the via-hole to decrease stepwise or continuously toward the front side of the substrate because it may minimize separation of emitter electrodes (25) during preparation of a solar cell and maximize the area of light receiving parts on the front side of the substrate.

The diameter of the via-hole (30) may be 25 to 100 μm, preferably 30 to 90 μm, and more preferably 30 to 80 μm. It may be advantageous for the diameter of the via-hole (30) to be controlled within the above range considering the efficiency of an emitter electrode (25) filling process and the area of light receiving parts of the front side of the substrate and the like.

Meanwhile, the EWT solar cell according to the present invention includes a first conductive type of base electrode (15) formed inside of the first trench (10) and a second conductive type of emitter electrode (25) formed inside of the second trench (20) and the via-hole (30).

In the present invention, the expression that the base electrode (15) is formed inside of the first trench (10) means that it is formed so as to occupy a part of the whole of the space formed by the first trench (10).

Figure 2B:
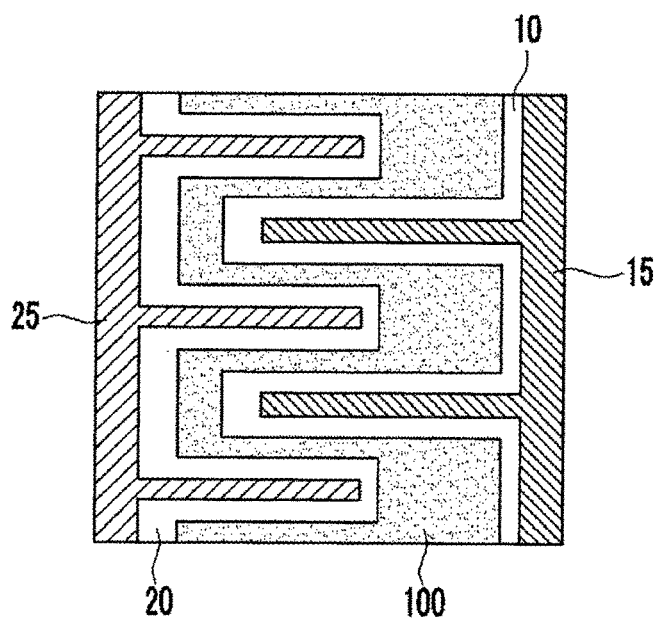
Figure 3B:
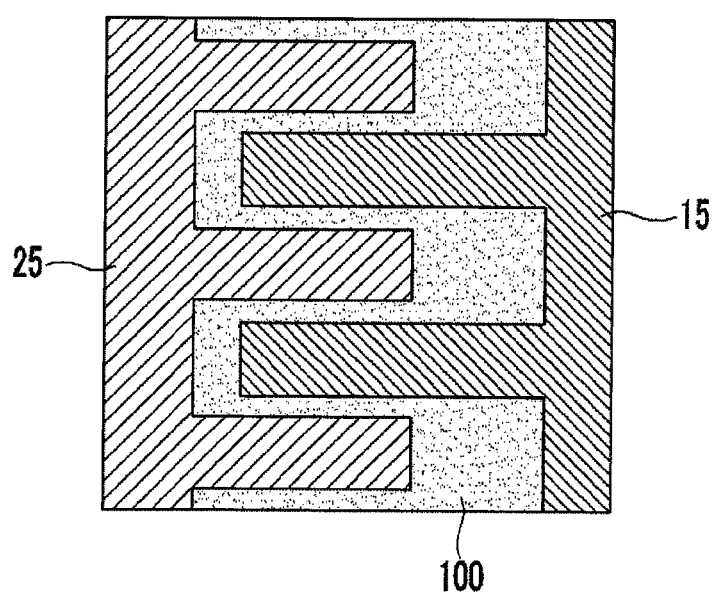

That is, as shown in FIG. 2a and FIG. 2b, the base electrode (15) may be formed so as to occupy a part of the space formed by the first trench (10), preferably to the same height as the depth of the first trench (10). Alternatively, as shown in FIG. 3a and FIG. 3b, the base electrode (15) may be formed so as to occupy the whole space formed by the first trench, preferably to the same height as the depth of the first trench (10). Similarly, the emitter electrode (25) may occupy a part or the whole of the space formed by the second trench (20) and the via-hole (30).

However, according to the present invention, each electrode may preferably have the form as shown in FIG. 2a and FIG. 2b, for production efficiency. Also, the area of the empty space between each electrode and the substrate in FIG. 2a and FIG. 2b or the form of FIG. 3a and FIG. 3b wherein each electrode is completely filled in each trench is exaggerated for explanation of one embodiment of the invention, and the EWT solar cell according to the present invention is not limited to the examples shown in the drawings.

According to the EWT solar cell of the present invention, since the base electrode (15) and the emitter electrode (25) are formed inside of each trench, electrode isolation effect is excellent, thus minimizing generation of leakage current, and there is no height difference between electrodes, thus minimizing the energy conversion efficiency measurement error.

The base electrode (15) may be a first conductive type which is the same as the conductivity of the substrate, preferably p-type, and the emitter electrode (25) may be a second conductive type which is different from that of the base electrode (15), preferably n-type.

Further preferably, the base electrode (15) and the emitter electrode (25) may be interdigitated like the structure of trenches formed on the rear side of the substrate, and thereby each electrode may have a herringbone form wherein multiple finger electrodes are connected to a bus bar electrode.

Meanwhile, according to another embodiment of the invention, a method for preparing an emitter wrap-through solar cell is provided, including:

preparing a first conductive type of semiconductor substrate (100) having a front side facing the sun during normal operation and a rear side opposite to the front side;

forming a first trench (10) and a second trench (20) that are physically separated from each other on the rear side, and forming at least one via-hole (30) penetrating the substrate through the second trench;

forming a second conductive type of emitter layer (40) respectively on the fronts side of the substrate, on the inner side of the second trench (20), and on the inner side of the via-hole (30);

forming a passivation layer (60) on the rear side of the substrate and on the bottom side of the first trench (10), and forming an anti-reflection layer (65) on the front side of the substrate; and forming a first conductive type of base electrode (15) inside of the first trench (10), and forming a second conductive type of emitter electrode (25) inside of the second trench (20) and the via-hole (30).

Hereinafter, referring to FIG. 5, a method for preparing the EWT solar cell according to the above embodiment will be explained.

Figure 5:
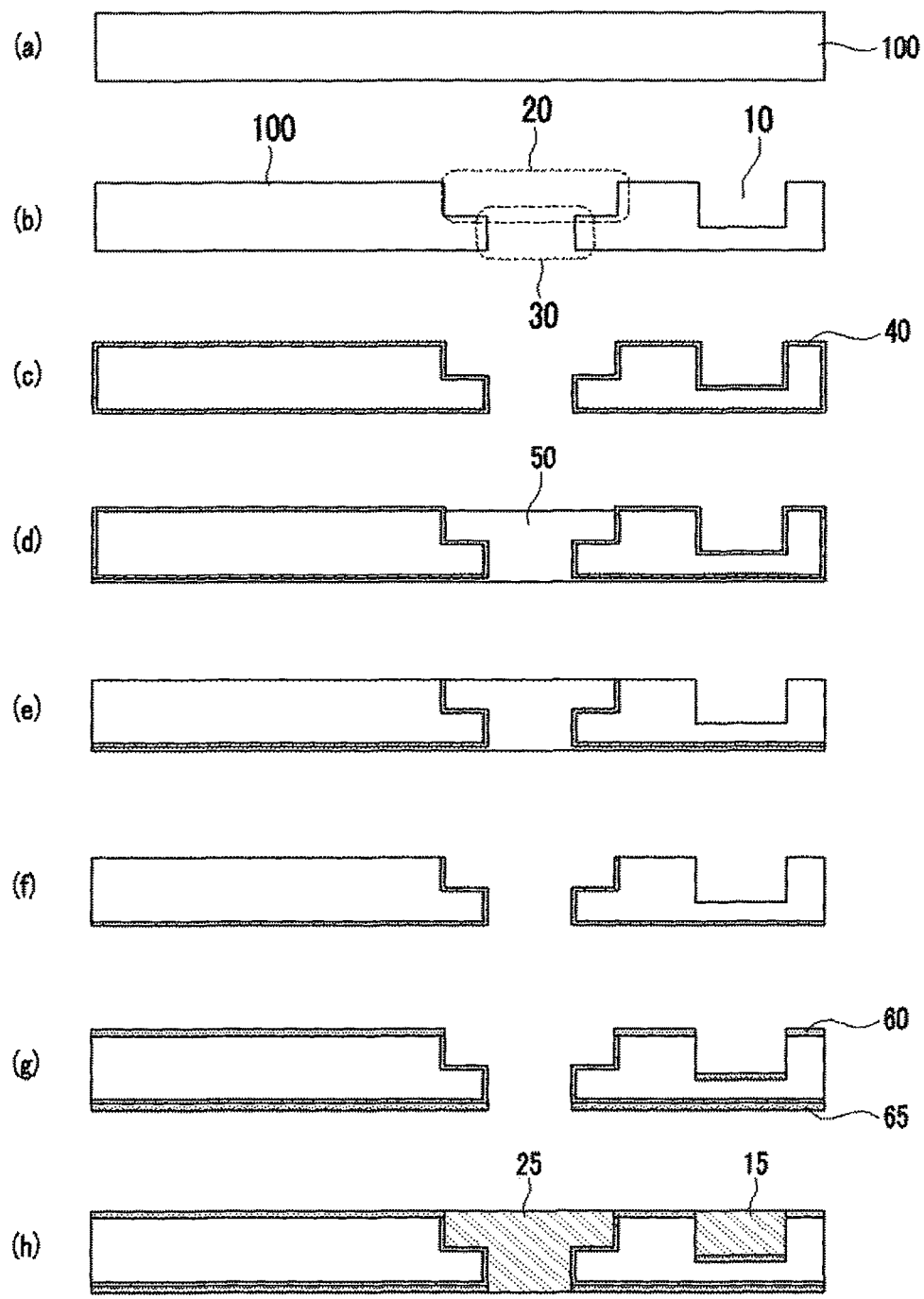
FIG. 5 is a process flow chart schematically showing a method of preparing the EWT solar cell according to one embodiment.

First, as show in FIG. 5 (a), a semiconductor substrate (100) is prepared. The semiconductor substrate (100) has a front side facing the sun during normal operation and a rear side opposite to the front side, and the thickness may be 150 to 220 μm. However, the thickness of the substrate may be determined considering mechanical properties required for a solar cell, the depth of a trench formed on a substrate, and the like, and is not limited to the above range.

The semiconductor substrate (100) may have a first conductive type, as a non-limiting example, it may be a p-type doped silicon wafer, and in addition, those common in the technical field to which the invention pertains may be applied.

Although not shown in FIG. 5 (a), the front side of the semiconductor substrate (100) may be textured so as to have an uneven structure as shown in FIG. 2a. The uneven structure may have various forms including a regular inverted pyramid pattern.

The texturing is to reduce reflection of sunlight on the front side of the substrate, and it may be produced by wet etching or dry etching such as reactive ion etching, and the like. As a non-limiting example, the wet etching may be conducted using an etchant composition including at least one alkali compounds selected from the group consisting of potassium hydroxide, sodium hydroxide, ammonium hydroxide, tetra(hydroxymethyl)ammonium, and tetra(hydroxyethyl)ammonium.

The etchant composition may include a cyclic compound having a boiling point of 100° C. or more, preferably 150 to 400° C. The cyclic compound may be included in the content of 0.1 to 50 wt %, preferably 2 to 30 wt %, more preferably 2 to 10 wt %, based on total weight of the composition. The cyclic compound may improve wettability of a crystalline silicon surface to prevent overetching by the alkali compound, and it also functions for rapidly dropping etched and dissolved hydrogen bubbles to prevent generation of bubble stick.

As shown in FIG. 5 (b), a step of forming physically a separated first trench (10) and second trench (20) on the rear side of the substrate, and forming at least one via-hole (30) penetrating the substrate through the second trench is conducted.

The first trench (10) and the second trench (20) may be formed by a common method in the technical field to which the invention pertains, and preferably, it may be formed by grooving a grid line on the rear side of the substrate (100) through laser grooving.

According to the present invention, the first trench (10) and the second trench (20) may be formed to be physically separated from each other and not connected, and while the shape is not specifically limited, but it may be advantageously interdigitated for improvement in solar cell efficiency.

The first trench (10) and the second trench (20) may be respectively independently formed on the rear side of the substrate to a width of 200 to 700 μm and a depth of 20 to 60 μm. The depth and the width of each trench may be variously changed considering the width and the depth of electrodes formed inside of each trench, the effect of electrode isolation, the thickness of the substrate, and the like, and are not limited to the above range.

At least one via-hole (30) may be formed so as to penetrate the substrate through the second trench (20). To form the via-hole (30), laser drilling, wet etching, dry etching, mechanical drilling, water jet machining, a combined process, or the like may be applied, and laser drilling may be advantageous in terms of process efficiency and accuracy improvement.

As a non-limiting example, if the laser drilling is used, a laser with sufficient strength may be preferably used so as to form one hole per 0.5 to 5 ms, and a Nd:YAG laser and the like may be used. The diameter of the via-hole (30) may be controlled to 25 to 100 μm, preferably 30 to 90 μm, and more preferably 30 to 80 μm.

As such, if the first trench (10), the second trench (20) and the via-hole (30) are formed using a laser, thermal damage to the substrate may be involved, and in this case, damage removal etching may be further conducted. As a non-limiting example, the process is used to remove a damage area such as a burr on the surface of the substrate, and it may be conducted using an etchant composition including an alkali compound at a temperature of 70 to 100° C. for 1 to 10 minutes.

Subsequently, a step of forming a second conductive type of emitter layer (40) respectively on the front side of the substrate, the inner side of the second trench (20) and the inner side of the via-hole (30) is conducted.

This step forms an emitter layer (40) on the front side of the substrate (100) and on the area where an emitter electrode (25) is to be formed, and according to the present invention, it may be conducted in the order of FIG. 5 (c) to (f).

FIG. 5 (c) shows a process of forming a second conductive type of emitter layer (40) around the substrate, wherein the process may be conducted by heat treating the semiconductor substrate (100) in the presence of a gas including a second conductive type of impurity, or by using a solid state source or spray-on diffusion type of source containing a second conductive type of impurity.

For example, a second conductive type of impurity, i.e., gas phase $POCl_3$, $P_2O_5$, $PH_3$, or a mixture thereof, is mixed with a carrier gas of inert gas and supplied, and the semiconductor substrate (100) is heat treated to 800 to 900° C. for 10 to 60 minutes. It may be advantageous in terms of solar cell efficiency for the second conductive type of emitter layer (40) to have sheet resistance of 20~60 Ω/sq.

FIG. 5 (d) shows a process of forming an etching-resist (50) to remove the emitter layer formed on the rear side of the substrate (100), wherein the etching-resist (50) may be formed on the front side of the substrate (100), the inner side of the second trench (20), and the via-hole (30). The composition used to form the etching-resist (50) is not specifically limited as long as it is physically and chemically stable during the etching process of the semiconductor substrate.

The etching-resist (50) may be formed by coating a resist composition by printing such as inkjet printing, masking, stenciling, screen printing, and the like, wherein the resist composition should not exceed the groove width of the grid line (i.e., the width of the second trench).

FIG. 5 (e) shows a process of selectively removing the emitter layer (40) on the side where the etching-resist is not formed, wherein etching time and the like may be controlled so as to etch to a depth of the emitter layer to be removed.

FIG. 5 (*f*) shows a process of removing the etching-resist, and the process may be conducted by a common method in the technical field to which the invention pertains. After the process of removing etching-resist, a step of washing the substrate using ammonia water, hydrogen peroxide, or a mixture thereof may be further conducted.

As explained above, the emitter layer (40) may be formed on the front side of the substrate (100) and on the area where an emitter electrode (25) is to be formed in the order of FIG. 5 (*c*) to (*f*). However, the above process order and method are no more than one embodiment according to the present invention, and various processes may be applied to achieve the state as shown in FIG. 5 (*f*).

Subsequently, as shown in FIG. 5 (*g*), a step of forming passivation layers (60) on the rear side of the substrate and on the bottom layer of the first trench (10) and forming an anti-reflection layer (65) on the front side of the substrate is conducted.

The passivation layer (60) aids in decreasing loss of photogenerated carriers on the rear side of the substrate, and decreasing electrical loss due to shunt currents.

The anti-reflection layer (65) is a dielectric layer that is formed on the emitter layer (40) on the front surface of the substrate, and it may function to prevent escape of light received inside of the solar cell to the outside of the solar cell, and function to passivate surface defects acting as a electron trap site on the front side of the substrate.

The functions of the passivation layer (60) and the anti-reflection layer (65) may be exhibited by a single material or multiple different materials, and the anti-reflection layer (65) may be a monolayered thin film or a multilayered thin film.

As non-limiting examples, the passivation layer (60) and the anti-reflection layer (65) may independently be a monolayered thin film or a multilayered thin film including at least one selected from the group consisting of a semiconductor oxide, a semiconductor nitride, a semiconductor oxide containing nitrogen, a semiconductor nitride containing hydrogen, $Al_2O_3$, $MgF_2$, ZnS, $MgF_2$, $TiO_2$, and $CeO_2$.

The passivation layer (60) and the anti-reflection layer (65) may be respectively formed by a thin film forming method commonly applied in a semiconductor passivation process, and for example, it may be formed by physical vapor deposition (PVD), chemical vapor deposition (CVD), plasma enhanced chemical vapor deposition (PECVD), thermal evaporation, and the like, or it may be formed by a common printing process using ink or paste.

Subsequently, as shown in FIG. 5 (*h*), a step of forming a first conductive type of base electrode (15) inside of the first trench (10) and forming a second conductive type of emitter electrode (25) inside of the second trench (20) and the via-hole (30) is conducted.

Particularly, according to the method for preparing the EWT solar cell of the present invention, since each electrode is formed inside of each trench, the alignment state of each electrode may be exactly detected with the naked eye, thus providing productivity improvement.

According to the present invention, the base electrode (15) may be p-type that is identical to the conductive type of the substrate, and the emitter electrode (25) may be n-type that is the opposite conductive type.

The composition used to form the base electrode (15) and the emitter electrode (25) may be those commonly used in the technical field to which the invention pertains, and is not specifically limited. However, preferably, the base electrode (15) may be formed using an aluminum-based composition, and the emitter electrode (25) may be formed using a silver-based composition. Each electrode may be formed by printing the composition on a corresponding area.

Herein, the base electrode (15) may be formed so as to occupy a part of the space formed by the first trench (10) as shown in FIG. 2*a* and FIG. 2*b*, or it may be formed so as to occupy the whole space formed by the first trench (10). Similarly, the emitter electrode (25) may occupy a part or the whole of the space formed by the second trench (20) and the via-hole (30).

The base electrode (15) and the emitter electrode (25) formed by the above method may be interdigitated like the structure of trenches formed on the rear side of the substrate, and thereby each electrode may have a herringbone shape wherein multiple finger electrodes are connected to a bus bar electrode.

Hereinafter, preferable examples are presented for complete understanding of the invention. However, these examples are only to illustrate the invention, and the invention is not limited thereto.

EXAMPLE

Preparation of EWT Solar Cell

Multiple via-holes (30) having a depth of about 180 μm and a diameter of about 80 μm were formed on a p-type doped silicon wafer (thickness of about 180 μm) using a laser drilling machine (Nd:YAG laser), and subsequently, a first trench (10) having a width of about 600 μm and a depth of about 60 μm, and a second trench (20) having a width of about 400 μm and a depth of about 60 μm were formed to obtain a substrate having the cross-section as shown in FIG. 5 (*b*).

By heat treating the substrate under a $POCl_3$ gas atmosphere and a temperature of about 850° C. for about 30 minutes, an emitter layer (40) with sheet resistance of about 50Ω/□ was formed.

Subsequently, as shown in FIG. 5 (*d*), etching-resist (50) was printed on the substrate by screen printing, and the substrate was dipped in a composition including nitric acid and fluoric acid for about 3 minutes to remove the emitter layer formed on the rear side of the substrate as shown in FIG. 5 (*e*). The substrate was then dipped in an organic solvent including alcohol such as methanol and ethanol and the like for about 1 hour to remove the etching-resist.

Subsequently, silicon nitride films with a thickness of about 80 nm were formed on both sides of the substrate using PECVD to obtain the substrate as shown in FIG. 5 (*g*) (using a mixed gas of $SiH_4$ and $NH_3$, deposition time of about 200 seconds).

Then, an aluminum-based paste was printed inside of the first trench of the substrate to a width of about 400 μm to form a base electrode (15); and a silver-based paste was printed inside of the via-hole and the second trench to a width of about 200 μm to form an emitter electrode (25), thus preparing an EWT solar cell.

The invention claimed is:
1. An emitter wrap-through solar cell comprising:
a first conductive type of semiconductor substrate having a front side facing the sun during normal operation and a rear side opposite to the front side, wherein a first trench and a second trench are formed on the rear side while being physically separated, and at least one via-hole penetrating the substrate through the second trench is formed; and a first conductive type of base electrode formed inside of the first trench, and a second conductive type of emitter electrode formed inside of the second trench and the via-hole.

2. The emitter wrap-through solar cell according to claim 1, wherein the first trench and the second trench are physically separated from each other and interdigitated.

3. The emitter wrap-through solar cell according claim 1, wherein the semiconductor substrate is a p-type doped silicon wafer.

4. The emitter wrap-through solar cell according claim 1, wherein the front side of the semiconductor substrate is textured to an uneven structure.

5. The emitter wrap-through solar cell according claim 1, wherein the semiconductor substrate has a thickness of 150 to 220 μm.

6. The emitter wrap-through solar cell according claim 1, wherein the first trench and the second trench are respectively independently formed on the rear side of the substrate to a width of 200 to 700 μm and a depth of 20 to 60 μm.

7. The emitter wrap-through solar cell according claim 1, wherein the via-hole has a diameter of 25 to 100 μm.

8. The emitter wrap-through solar cell according claim 1, wherein the base electrode occupies the whole space formed by the first trench, and the emitter electrode occupies the whole space formed by the second trench and the via hole.

9. A method for preparing an emitter wrap-through solar cell, comprising:
preparing a first conductive type of semiconductor substrate having a front side facing the sun during normal operation and a rear side opposite to the front side;
forming a first trench and a second trench that are physically separated from each other on the rear side of the substrate, and forming at least one via-hole penetrating the substrate through the second trench;
forming a second conductive type of emitter layer respectively on the front side of the substrate, on the inner side of the second trench, and on the inner side of the via-hole;
forming a passivation layer on the rear side of the substrate and on the bottom side of the first trench, and forming an anti-reflection layer on the front side of the substrate; and
forming a first conductive type of base electrode inside of the first trench, and forming a second conductive type of emitter electrode inside of the second trench and the via-hole.

10. The method according to claim 9, wherein the first trench and the second trench are formed by laser grooving.

11. The method according to claim 9, wherein the first trench and the second trench are physically separated from each other and interdigitated.

12. The method according to claim 9, wherein the first trench and the second trench are respectively independently formed on the rear side of the substrate to a width of 200 to 700 μm and a depth of 20 to 60 μm.

13. The method according to claim 9, wherein the via-hole is formed by laser drilling, wet etching, dry etching, mechanical drilling, water jet machining, or a combined process thereof.

14. The method according to claim 9, wherein the base electrode is formed so as to occupy the whole space formed by the first trench, and the emitter electrode is formed so as to occupy the whole space formed by the second trench and the via hole.

* * * * *